United States Patent [19]

Chen et al.

[11] 4,263,661

[45] Apr. 21, 1981

[54] MAGNETIC BUBBLE DOMAIN ORGANIZATION USING DOUBLE PERIOD INPUT/OUTPUT DEVICES

[75] Inventors: Thomas T. Chen, Placentia; Isoris S. Gergis, Yorba Linda, both of Calif.

[73] Assignee: Rockwell International Corporation, El Segundo, Calif.

[21] Appl. No.: 47,438

[22] Filed: Jun. 11, 1979

[51] Int. Cl.³ .............................................. G11C 19/08
[52] U.S. Cl. ........................................ 365/15; 365/43
[58] Field of Search ........................ 365/15, 16, 39, 43

[56] References Cited

U.S. PATENT DOCUMENTS 4,007,453  2/1977  Bonyhard ............................... 365/15
4,079,461  3/1978  George et al. .......................... 365/15

OTHER PUBLICATIONS

IEEE Transactions on Magnetics–vol. Mag-12, No. 6, Nov. 1976, pp. 614–617.

*Primary Examiner*—James W. Moffitt
*Attorney, Agent, or Firm*—H. Fredrick Hamann; Daniel R. McGlynn

[57] ABSTRACT

There is shown and described a magnetic bubble domain device organization using certain propagation elements which have expanded size relative to the remainder of the propagation elements in order to improve device or system operation.

7 Claims, 9 Drawing Figures

MAGNETIC BUBBLE DOMAIN ORGANIZATION USING DOUBLE PERIOD INPUT/OUTPUT DEVICES

The invention herein described was made in the course of or under a contract or subcontract thereunder, with the Air Force.

BACKGROUND OF THE INVENTION

1. Field of the Invention

This invention is directed to magnetic bubble domain devices or systems, in general, and to improved systems with period stretching devices, in particular.

2. Prior Art

In the present state of the art magnetic bubble domain systems, major tracks serve to propagate the bubbles to and from the input and output ports of the system in basically the same propagation elements as those in the storage loops. That is, the basic propagation elements all have the same general size, shape and operating characteristics. The basic propagation elements in the minor loops are designed for maximum storage density and to provide adequate bias margin for reliable propagation. The use of these same propagation elements in major tracks, such as input/output tracks or the like requires that the spacing between switches on the major track be at least equivalent to two bits (or periods) in length. That is, because of the geometry of the storage loops, the switches are spaced along the major track by the appropriate distance. As a result, each output track can handle only alternate bit streams from the storage loops. Therefore, in order to bring the data rate of the magnetic bubble domain system up to the operating speed or data rate of the intrinsic field rate, a pair of input/output (major) tracks are used to handle each of the input/output functions. This type of organization is known in the art as the "split field" or "ping-pong" scheme. In either of these known schemes, the two output tracks either merge together into one detector or each delivers a bubble to a separate detector. The first mentioned approach increases the length of the major tracks by about fifty percent which adds to the access time in retrieving information from storage. The second approach increases the lead count on the magnetic bubble domain and requires more electronic circuitry and, thus, adds to the cost of the module. Each of these above known techniques also adds to complexity and, therefore, reduces reliability of the chip.

SUMMARY OF THE INVENTION

The invention relates to the use of oversize propagation elements in the major propagation paths or tracks. In particular, the oversize element spans the distance between adjacent minor loops in a major/minor loop configuration. Thus, the full data output rate equals the intrinsic field data rate without sacrificing access time, geometry or complexity.

DESCRIPTION OF THE PREFERRED EMBODIMENT

Figure 1:
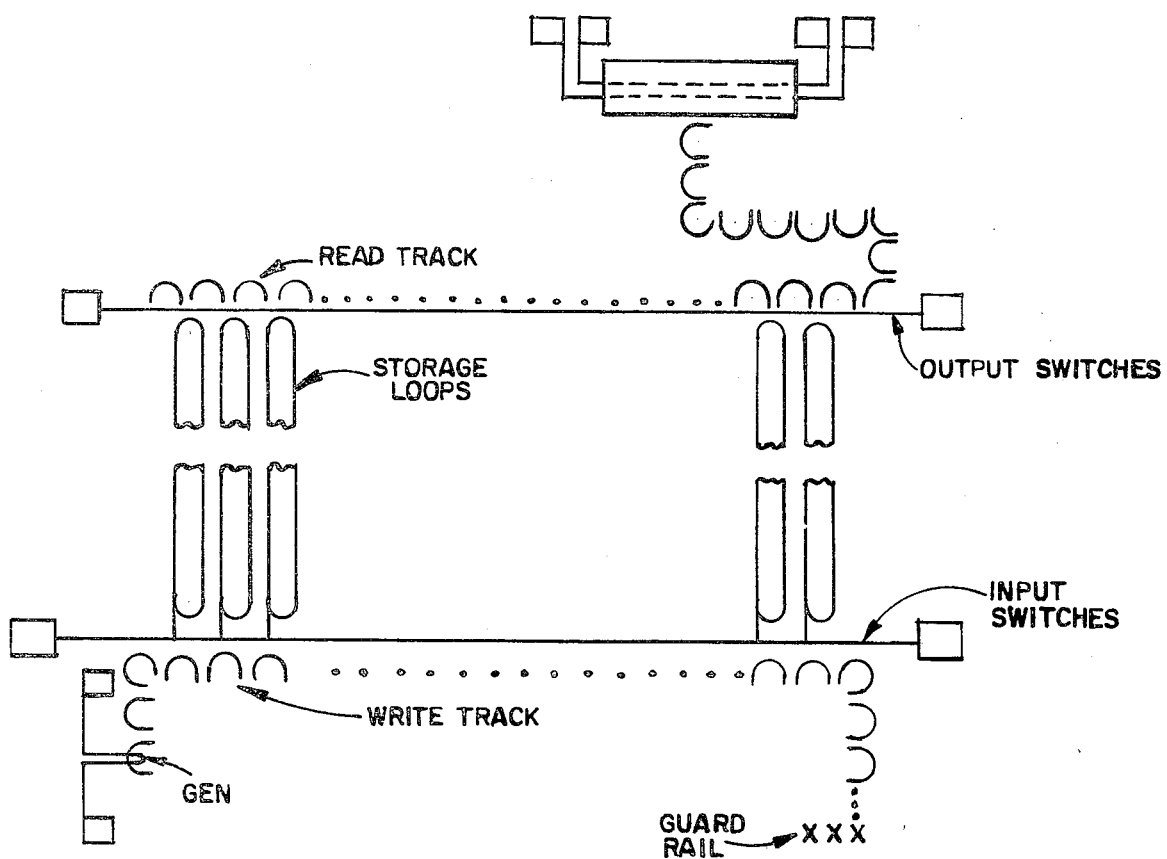
FIG. 1 is a schematic representation of a two port major/minor loop system configuration.

Referring now to FIG. 1, there is shown a schematic representation of a block replicate organization using "double-period" major loop tracks. In particular, a plurality of storage loops of typical design using chevrons or the like are provided. An input arrangement is provided using a write track disposed adjacent to first ends of the storage loops. The write track comprises a plurality of propagation elements which are schematically represented as being of approximately twice the size of the propagation elements included in the storage loops. That is, the propagation elements in the write track are arranged to span the distance between adjacent storage loops. In the embodiment shown, each of the propagation elements in the write track has the configuration of a gap tolerant type of device (see U.S. Pat. No. 4,075,611). The write track is arranged in an appropriate manner to selectively transfer bubbles from to the respective storage loops in accordance with operation of the input switches associated therewith. The input switches can taken the form of swap switches or transfer-in switches.

At the input end of the write track, there is provided a generator device of suitable configuration such as will be described hereinafter. At the output or terminal end of the write track, the track is merged into or joined with the guard rail of suitable configuration.

At the other ends of the storage loops, there is provided the output or read track which comprises a plurality of propagation elements similar to those utilized in the write track. Again, appropriate output switches are disposed between the output ends of the storage loops and the read track. The output switches can take the form of replicate switches or replicate/transfer switches as described hereinafter. The read track takes an appropriate configuration and is joined to the detector circuit or structure of an appropriate configuration.

In operation, a bubble is generated by the generator in usual fashion. Typically, signals are applied to the pads associated with the generator to produce current signals wherein the generator produces a bubble in the propagation element which forms a portion thereof. The bubble propagates along the write track in response to the usual rotating magnetic field. When desired, the input switches are activated by applying pulses at the pads associated with the switch conductor. The bubbles are, thus, selectively transferred to the storage loops in storage therein.

Similarly, the bubbles are transferred from the storage loops to the read track by the application of a control signal to the output switches. The control signal takes the form of a current pulse which is supplied to the pads associated with the conductor of the output switches. The detector operates to detect bubbles which pass therethrough after propagating along the read track. The signals at the detector are observed by connecting appropriate sensing/amplifying circuitry to the pads associated with the conductor of the detector.

Figure 2:
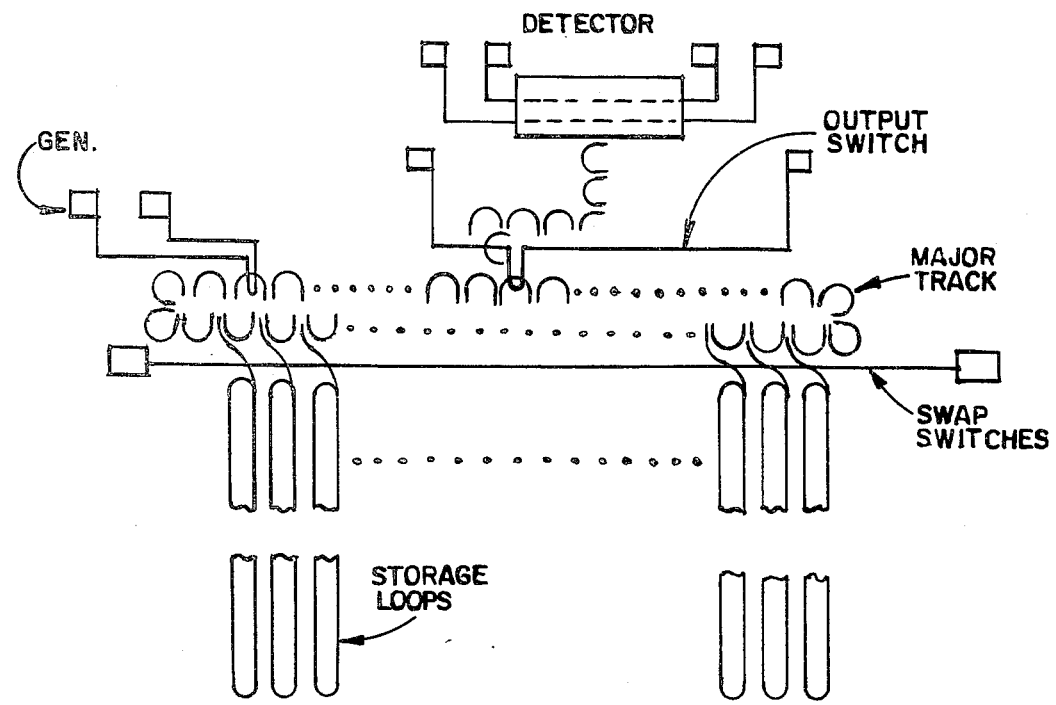
FIG. 2 is a schematic representation of a single loop major/minor loop system configuration.

Referring now to FIG. 2, there is shown a major/minor loop organization utilizing "double period" major loop propagation elements. Again, a plurality of storage loops are provided. The storage loops form the minor loops in this type of configuration. The major or input/output track is disposed adjacent to all of the storage loops. In particular, the major track is disposed adjacent to the same end of each of the storage or minor loops. Swap switches of appropriate design are interposed between the major and minor loops. The swap switches are of any suitable configuration and may be exchange switches or the like. A generator of suitable design is provided in the major track. In addition, an output track between the major track and the detector is provided. An output switch is inserted between the output track and the major track. The output switch may be of the replicate/transfer type of appropriate design. Again, the detector is of any appropriate design for this type of system.

In operation, a bubble is produced at the generator by applying a pulse at the pads associated with the generator conductor. The bubble propagates along the major track in response to the rotating magnetic fields as is known in the art. When the bubbles have reached the appropriate position in the major track adjacent to the storage loops, the swap switches are activated by applying a current pulse of appropriate magnitude and duration to the swap switches via the conductor pads associated therewith. The bubbles are then transferred into the storage loops for storage.

Conversely, when it is desired to remove bubble domains from the storage area, the bubbles are switched from the storage loop to the major track by means of the swap switches again. This operation is also controlled by applying a current pulse of appropriate magnitude, polarity and duration. The bubbles then propagate around the major track and are selectively switched via the output switch to the detector. In the replicate mode, a nondestructive readout is possible.

Figure 3:
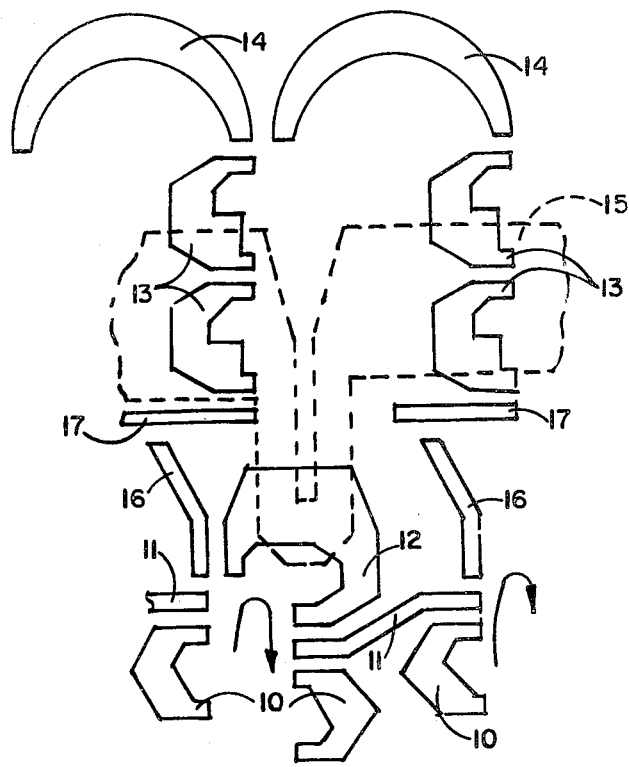
FIG. 3 is a replicate/transfer switch.

Referring now to FIG. 3, there is shown a schematics representation of a replicate/transfer switch such as shown in FIGS. 1 or 2 at the output region. In FIG. 3, the asymmetrical chevron type gap tolerant devices form the major devices in the propagation path or storage loop, per se. Likewise, the twisted I-bars 11 and 16, as well as the corner element 12, are included in the storage loop. Propagation through the loop is suggested by the arrows associated therewith. The large double size elements 14 form a portion of the major track in either of the techniques or systems shown in FIGS. 1 and 2. Intermediate paths comprising elements 17 and 13 are used as a portion of the replicate/transfer switch to, essentially, interface between the storage loop in the major track. Conductor 15 shown in dashed outline is provided to control the transfer of bubbles from the storage loop to the major track. Thus, the bubbles propagate through the storage loop and are selectively split into the two bubbles by the application of a current pulse on conductor 15. The trailing bubble is then transferred from element 17 and, thence, to elements 13 and, ultimately, element 14. It is seen that elements 14 span the distance between adjacent storage loops (see also FIGS. 1 and 2) such that there is no delay or rate reduction in data flow relative to the data rate in the storage loops. That is, bubbles switched out of adjacent storage loops at elements 13 are applied to adjacent elements 14. Thus, no intervening elements are required and data output is produced for each rotation of the rotating field.

Figure 4:
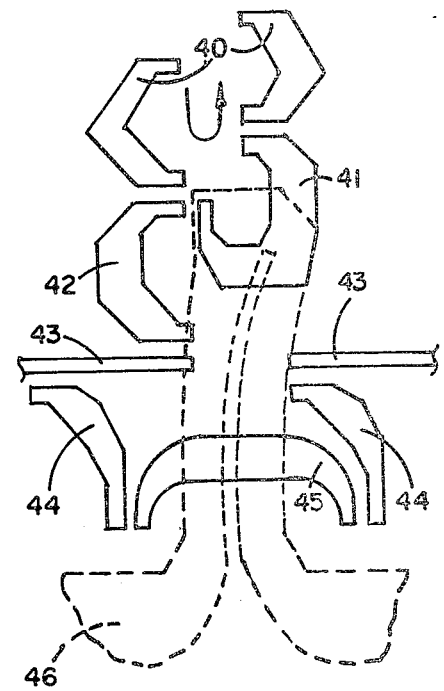
FIG. 4 is a swap gate design.

Referring now to FIG. 4, there is shown a schematic representation of a swap gate design for use in the instant invention. Again, a minor or storage loop is provided by the asymmetric, gap-tolerant type devices 40. The corner element 41 is included in the storage loop and bubbles propagate through the loop as indicated by the arrow. The output track or loop includes double size elements 45 as well as a plurality of "hand gun" elements 44. Associated with elements 44 are bar elements 43 and gap tolerant elements 42 which form a portion of the switch mechanism. A conductor 46, shown in dashed outline, is also disposed adjacent to the elements of the device.

In operation, the bubble propagates through the storage loop which includes elements 40 and 41. With the application of a control signal on conductor 46, the bubble is blocked and transferred to bar element 43. From thence, the bubble propagates to element 44 and, thence, to the adjacent element 45.

At the same time, the bubble propagating along the major track around element 45 is blocked by the current in conductor 46. The bubble then stretches and transfers to element 43 and, from there, to element 42. The bubble then propagates along element 42 and is transferred to elements 40 and, thereby, is stored in the appropriate loop. A bubble can be swapped from the major loop to the minor or storage loop on a one-to-one basis. In addition, no timing control or reduction in data rate occurs.

Figure 5:
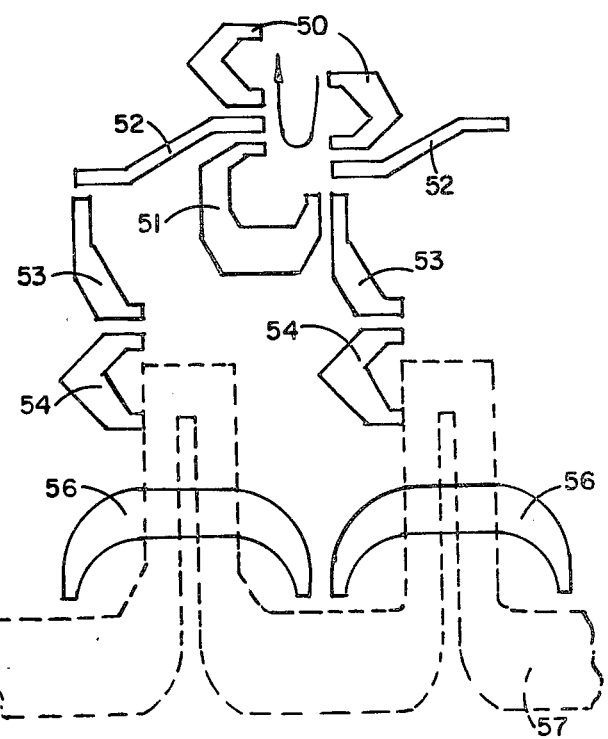
FIG. 5 is a transfer-in switch.

Referring now to FIG. 5, there is shown a transfer-in switch apparatus. Again, the storage loop comprises chevron elements 50 and corner element 51. Magnetic pole elements are also provided by I-bars 52. Hand gun elements 53 are associated with other chevron elements 54 to provide a portion of the transfer-in switch path. The double-size elements 56 form the major track as noted above. Conductor 57, shown in dashed outline, is the control conductor. Again, bubbles propagating along the major track comprising elements 56 and are, selectively, blocked by the application of a current signal on conductor 57. The bubbles stretch out and transfer to elements 54, 53, 52 and 50 in sequence wherein the bubble is stored in the minor loop and circulates in accordance wtih the arrow shown. In this instance, the bubbles are normally removed from the storage loop at the other end by an appropriate switching technique or apparatus.

Figure 6:
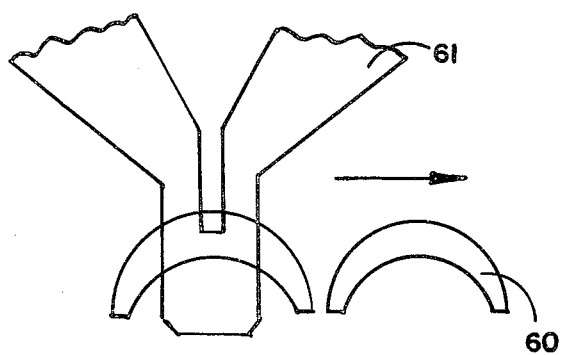
FIG. 6 is a four-bit-spacing exchange switch.

Referring now to FIG. 6, there is shown a schematic representation of a generator using the double period track of the instant invention. Again, double period track elements 60 are arranged to provide a major track or the like in any of the aforementioned devices. Conductor 61 is associated therewith to selectively apply a control pulse. When the pulse is applied, a bubble is generated in the double period track element 60 in accordance with known techniques. In this generation of a bubble, the bubble propagates in the direction indicated by the arrow. Thus, there is shown, a generator device which can be used in the systems shown in FIG. 1 or 2.

Figure 7:
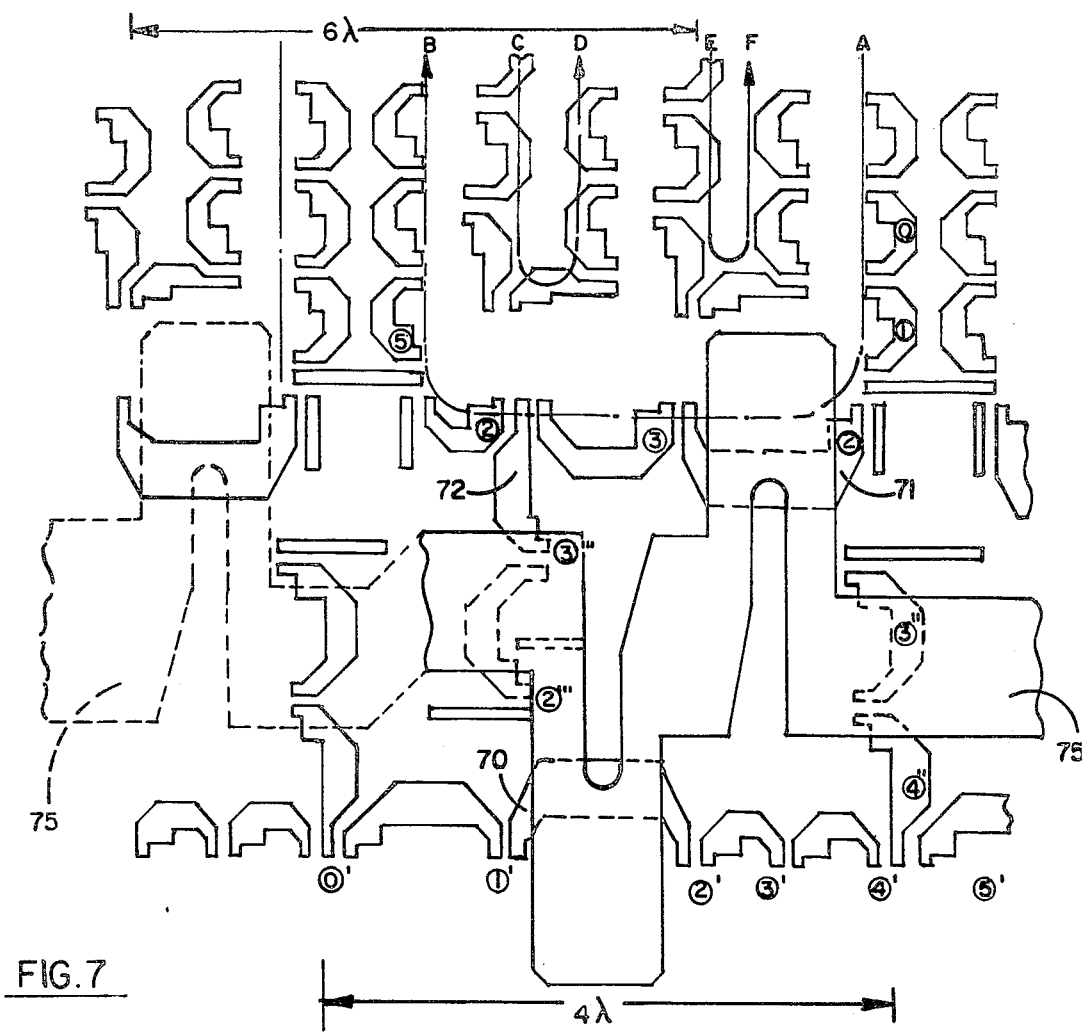
FIG. 7 is a generator design.

Referring now to FIG. 7, there is shown a more detailed arrangement of an exchange switch. In this showing, a larger, folded storage loop is suggested. For example, the storage loop includes an elongated path which is represented by arrows. It may be considered that the path comprises a storage loop can now store more information, the spacing between the respective switches associated therewith becomes greater. In order to maintain the same data throughput, it is desirable to include the double width elements 70 and 71 as shown. The output port shown in FIG. 7 includes one way transfer switches which include elements 70 and 71 and, as well, merge elements which comprise elements 72 and 73.

In operation, the normal paths of bubble propagation are shown sequentially. These normal paths are 0, 1, 2, 3, 4, 5, and 0', 1', 2', 3', 4' and 5'. However, in the exchange operation, paths are arranged to be 0', 1', 2''', 3''', 4, 5 and 0, 1, 2, 3'', 4'', 5', respectively. The paths are not shown as to precise pole locations. Thus, it is seen that with this circuit arrangement, a four bit spacing switch is provided. This spacing arrangement permits better data throughput for the system. That is, the spacing between the loops is 6λ while the spacing in the switches is 4λ. While the spacing is not precisely equivalent, an improvement of one-third in through rate is produced.

Figure 8:
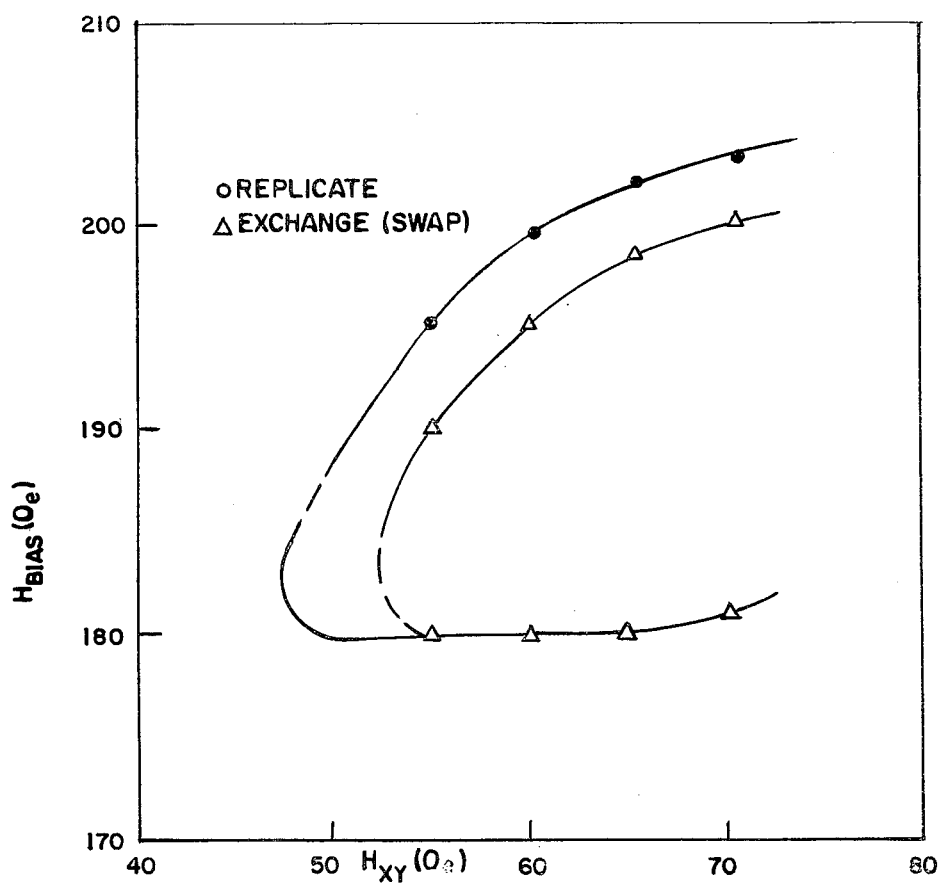
FIGS. 8 and 9 are graphic representations of the bias margin versus a drive field for the device shown in FIG. 4.
Figure 9:
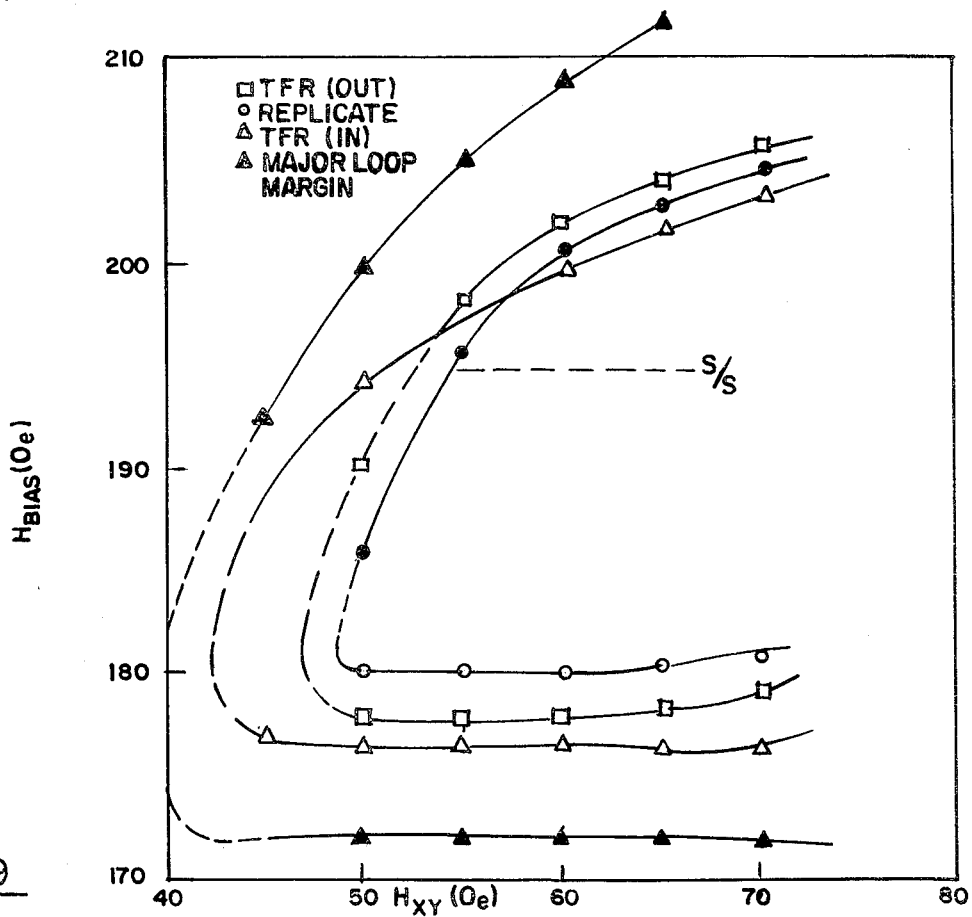

Referring now to FIGS. 8 and 9, there are shown graphic representations of the bias margin versus drive field for various components. In particular, FIG. 8 relates to the device shown in FIG. 4 while FIG. 9 relates to the devices shown in FIGS. 3 and 5. The graphs or charts show the various relationships of the bias, for example in the replicate or exchange operations, in FIG. 8 and the transfer-out, replicate, transfer-in and major loop margin in FIG. 9.

Thus, there has been shown and described a concept of improved magnetic bubble domain organizations using double period input/output tracks to enhance device performance. With the use of this type of device in the major track, a full data stream can be handled. The needs for unusual or complicated systems to achieve this data rate is avoided.

In the preferred embodiment, gap tolerant propagation elements have been utilized and are shown. This type of element has proven to be very flexible without affecting the propagation characteristics significantly. A variation in the size of the double width element of a factor of more than 2:1 has been demonstrated without any significant problems. In fact, the larger the element is, the wider its bias margin becomes. The only apparent limitation on the size of the element appears to be the frequency of operation inasmuch as the bubbles are required to move rapidly in the larger elements and the bubble speed is a function of the bubble domain layer material. However, bubble devices with 3 micron bubbles comprising elements as large as 32 microns in period have been operated satisfactorily up to 250 KHZ.

In addition, in permitting improved data throughput, the period stretching element has advantages in fabrication techniques. That is, the input/output port can be enlarged even in the situation where two level circuits are involved. When these circuits are enlarged, the alignment requirements between the permalloy level and conductor level can be significantly relaxed. This relaxation of tolerances permits better fabrication and, as well, greater yield in fabrication techniques.

Having thus described a preferred embodiment of the invention, what is claimed is:

1. A magnetic bubble device comprising:
    a layer of magnetic material in which magnetic bubbles can be propagated in response to an external rotating field;
    said layer comprising a plurality of discrete storage regions, each of said storage regions being sufficiently spaced apart from one another to prevent bubble-bubble interaction between bubbles in adjacent storage regions, each of said storage regions comprising a first plurality of propagation elements;
    a path comprising a second plurality of propagation elements located adjacent to said plurality of storage regions so that each one of said storage regions has access to said path at distinct and different positions along said path,
    each of said second plurality of propagation elements being sufficiently larger in size than each of said first plurality of propagation elements so as to enable the movement of a magnetic bubble along said path between said storage regions in one field rotation cycle.

2. A magnetic bubble domain propagation structure comprising a layer of magnetic material in which magnetic bubble domain can be propagated, including a first path for storing and supporting magnetic bubble domains including a plurality of spaced apart magnetically operative discrete elements of a first predetermined size separated by first predetermined distances, said elements being organized into a plurality of sets of storage loops spaced a second predetermined distance apart; and a second path located adjacent to said first path including a plurality of spaced apart magnetically operative discrete elements of a second predetermined size greater than said first predetermined size, a single one of said elements of said second path being located between corresponding ones of said sets of storage loops, the periodicity of said second path being twice that of said first path.

3. A propagation structure as defined in claim 2, wherein said second predetermined size is approximately twice that of said first predetermined size.

4. A propagation structure as defined in claim 2, wherein said discrete elements of said second path are crescent shaped.

5. A propagation structure as defined in claim 2, wherein said single one of said elements of said second path spans the distance between respective ones of said sets of storage loops.

6. A propagation structure as defined in claim 2, wherein each of said storage loops includes access means located at distinct and different positions of said second path for transferring bubbles from said respective storage loops to said second path.

7. A propagation structure as defined in claim 6, wherein said access means comprises a swap switch.

* * * * *